(12) United States Patent
Inoue et al.

(10) Patent No.: US 6,756,647 B2
(45) Date of Patent: Jun. 29, 2004

(54) SEMICONDUCTOR DEVICE INCLUDING NITRIDE LAYER

(75) Inventors: Masao Inoue, Hyogo (JP); Akinobu Teramoto, Hyogo (JP); Junichi Tsuchimoto, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/370,530

(22) Filed: Feb. 24, 2003

(65) Prior Publication Data

US 2004/0031985 A1 Feb. 19, 2004

(30) Foreign Application Priority Data

Aug. 15, 2002 (JP) ........................................ 2002-236962

(51) Int. Cl.[7] .............................................. H01L 29/76
(52) U.S. Cl. ..................... 257/411; 257/410; 257/640; 257/649; 257/760; 438/216; 438/261; 438/287; 438/591; 438/624; 438/724; 438/757
(58) Field of Search ...................... 257/410–411, 640, 257/649, 760; 438/216, 261, 421, 591, 595, 287, 954, 981, 724, 744, 757, 769, 791, 624

(56) References Cited

U.S. PATENT DOCUMENTS 5,963,810 A * 10/1999 Gardner et al. ............. 438/287
6,027,976 A * 2/2000 Gardner et al. ............. 438/287
6,563,182 B2 * 5/2003 Horikawa ................... 257/405
2001/0052618 A1 * 12/2001 Hasegawa ................... 257/345

FOREIGN PATENT DOCUMENTS

| JP | 5-183155 | 7/1993 |
|---|---|---|
| JP | 6-236994 | 8/1994 |
| JP | 10-12869 | 1/1998 |
| JP | 11-233758 | 8/1999 |
| JP | 2000-106432 | 4/2000 |

* cited by examiner

Primary Examiner—David Nelms
Assistant Examiner—Andy Huynh
(74) Attorney, Agent, or Firm—McDermott, Will & Emery

(57) ABSTRACT

A semiconductor device includes an n-type semiconductor substrate including a source region and a drain region in a main surface thereof, a high-permittivity insulator film including a high permittivity material and formed to cover an upper side of a region of the main surface of n-type semiconductor substrate, which region is interposed between source region and drain region. And the semiconductor device includes a boron-doped gate electrode formed above high-permittivity insulator film, and a high-permittivity nitride layer formed between high-permittivity insulator film and boron-doped gate electrode.

6 Claims, 5 Drawing Sheets

SEMICONDUCTOR DEVICE INCLUDING NITRIDE LAYER

BACKGROUND OF THE INVENTION

1. Field of the Invention

The present invention relates to a semiconductor device and, more specifically, to a technique to prevent boron implanted to a gate electrode from being diffused into a gate insulator film.

2. Description of the Background Art

A semiconductor device which has a structure including an insulator of an oxide film and metal film formed on a semiconductor substrate is referred to as MOS (Metal Oxide Semiconductor), and a transistor utilizing field effect is referred to as FET (Field Effect Transistor). A transistor having such a structure and utilizing the field effect is referred to as MOSFET, which is adopted into various devices.

The MOSFET has a gate insulator film and a gate electrode stacked on a main surface of a semiconductor substrate, and includes a source region, which is an electron source, and a drain region, which is an outlet of electrons, in the main surface of the semiconductor substrate. A p-channel MOSFET has an n-type semiconductor substrate with source and drain regions of p-type semiconductor. On the contrary, an n-channel MOSFET has a p-type semiconductor substrate with source and drain regions of n-type semiconductor.

A silicon oxide film formed by oxidation of a silicon substrate is commonly used as the gate insulator film, because it can easily be formed and has a good insulation property. A polysilicon film, rather than metal such as aluminum, is commonly used as the gate electrode because of its high thermal resistance. Since pure polysilicon has high electric resistance, it is doped with an impurity. In the p-channel MOSFET, boron is commonly used as the impurity. Doping of the gate electrode with boron is performed by a method to thermally diffuse boron into the gate electrode at high temperature, or by an ion implantation method wherein an ionized impurity is accelerated with an ion accelerator and driven to the object. The ion implantation method is preferred in recent years because of its good controllability. Boron implanted by the ion implantation method or the like is not electrically active, and a crystal structure of silicon becomes irregular due to collisions of ions. Annealing is thus performed to repair the irregular crystal structure of silicon and to electrically activate boron by placing the substrate in inert gas at high temperature.

In this annealing step, boron implanted into the gate electrode sometimes penetrates into the gate insulator film due to thermal diffusion. As a result, a threshold voltage may vary, or a current drive capability may be degraded. One technique to solve this problem is to implant nitrogen ions into the gate electrode prior to the boron implantation to form a nitride film in an end surface of the gate electrode, which end surface will contact with the gate insulator film. As nitrogen is previously implanted into the gate electrode, however, boron does not sufficiently diffuse near the nitride in the gate electrode during the following boron implantation, and a portion with high resistance may remain in the gate electrode. Therefore, there is another solution wherein a silicon nitride film is formed on an upper surface of the gate insulator film, as disclosed in Japanese Patent Laying-Open No. 11-233758.

FIG. 11 shows a cross-section of a general p-channel MOSFET. A source region 20 and a drain region 21 are formed spaced apart with each other in an upper surface of an n-type semiconductor substrate 1. A silicon insulator film 7 as a gate insulator film is formed on a main surface of n-type semiconductor substrate 1 so as to cover at least a portion interposed between the two regions. Silicon insulator film 7 is an oxide film formed by oxidation of a silicon substrate. A boron-doped gate electrode 6 is formed above silicon insulator film 7, and is formed with a polysilicon layer doped with boron. A silicon nitride layer 8 including nitrogen is formed between boron-doped gate electrode 6 and silicon insulator film 7 to prevent boron in boron-doped gate electrode 6 from diffusing to n-type semiconductor substrate 1. Silicon nitride layer 8 is formed by nitriding an upper portion of previously formed silicon insulator film 7.

On the other hand, it is necessary to enhance a current drive capability of a transistor due to higher integration of semiconductor devices in recent years. When a silicon oxide film is used as a gate insulator film, the silicon oxide film is made thinner for this necessity. As the film becomes thinner, its tolerance to penetrated boron decreases. In other words, an acceptable absolute magnitude of boron diffusion into the insulator film decreases because physical thickness of the insulator film decreases.

Because making of the thinner silicon oxide film has a limit, a study is made to use a high permittivity material for a gate insulator film in place of the silicon oxide film. In this specification, the term "high permittivity" means a relative permittivity higher than 3.9, and the material thereof is referred to as "a high permittivity material". Though the gate insulator film using the high permittivity material is physically thicker than the silicon oxide film, there is still a problem of penetration of boron which was implanted into the gate electrode.

SUMMARY OF THE INVENTION

An object of the present invention is to provide a semiconductor device enabling formation of thinner gate insulator film while keeping a tolerance to penetrated boron.

To attain the above-described object, a semiconductor device according to the present invention includes a semiconductor substrate including a source region and a drain region in a main surface thereof, a gate insulator film including a high permittivity material and formed to cover an upper side of a region interposed between the source region and the drain region, a gate electrode formed above the gate insulator film, and a nitride layer formed between the gate insulator film and the gate electrode. With this structure, boron implanted into the gate electrode can be prevented from penetrating into the gate insulator film by the nitride layer, and a variation in a threshold voltage value due to penetrated boron can be inhibited. In addition, the gate insulator film can be made thinner because the high permittivity material is used for the gate insulator film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

A structure of a semiconductor device in a first embodiment according to the present invention will now be described referring to FIG. 1.

Figure 1:
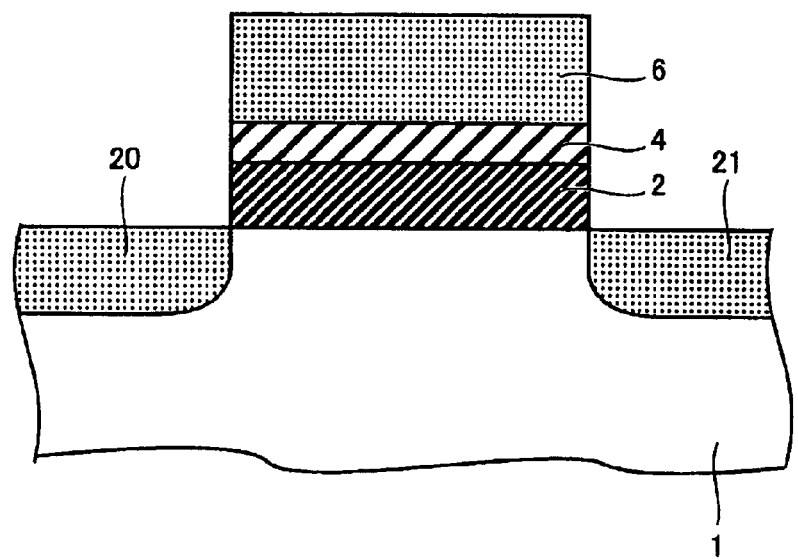
FIG. 1 is a cross-sectional view of a p-channel MOSFET in a first embodiment according to the present invention.

A p-channel MOSFET shown in FIG. 1 includes n-type semiconductor substrate 1, a high-permittivity insulator film 2 as a gate insulator film, and boron-doped gate electrode 6, and n-type semiconductor substrate 1 includes source region 20 and drain region 21. Source region 20 to be an electron source and drain region 21 to be an outlet of electrons are p-type semiconductors, and are formed spaced apart with each other in the main surface of n-type semiconductor substrate 1. Boron-doped gate electrode 6 is formed above high-permittivity insulator film 2, and is formed with polysilicon doped with boron for lowering the electrical resistance.

To keep insulation between boron-doped gate electrode 6 and n-type semiconductor substrate 1, the gate insulator film is formed to completely include a region on an upper surface of n-type semiconductor substrate 1, which region is interposed between source region 20 and drain region 21. In this embodiment, high-permittivity insulator film 2 is formed as the gate insulator film. High-permittivity insulator film 2 is formed using a high-permittivity material having a relative permittivity larger than 3.9, a relative permittivity of the silicon oxide film. The silicon oxide film is commonly used as the gate insulator film in this art. When the equivalent oxide thickness (Teq) is attained by using the high permittivity material for the gate insulator film, the actual physical thickness thereof will become larger than that of the silicon oxide film. $Al_2O_3$, $HfO_2$, $ZrO_2$, HfSiO, ZrSiO and the like can be used for high-permittivity insulator film 2. Each material has different relative permittivity. The physical thickness of high-permittivity insulator film 2 is determined to be, for example, 3–10 nm, depending on the relative permittivity of the material.

A high-permittivity nitride layer 4 as a nitride layer is formed on a main surface of high-permittivity insulator film 2. A high-permittivity nitride layer 4 can be formed by nitriding the high permittivity material. With the nitride layer, boron existing in boron-doped gate electrode 6 can be prevented from being diffused and intruding into high-permittivity insulator film 2.

Therefore, by forming the nitride layer between the gate insulator film and the gate electrode, boron implanted into the gate electrode remains in the gate electrode during an annealing step, and thus a threshold voltage shift of a p-channel MOSFET or decrease in a drive current capability can be inhibited. In addition, a current drive capability can be enhanced by making a thinner gate insulator film while keeping an effect to inhibit the thermal diffusion of boron and a tolerance to penetrated boron from the gate electrode.

Figure 3:
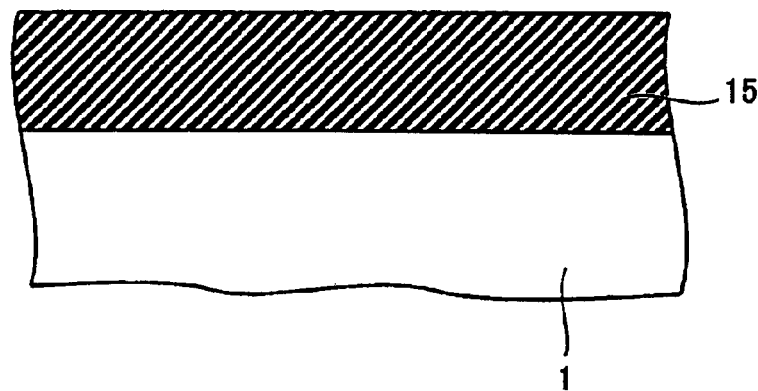
FIGS. 3 to 7 respectively show sequential manufacturing steps of the p-channel MOSFET in the first embodiment of the present invention.

A manufacturing method of the semiconductor device in this embodiment will now be described referring to FIGS. 3–7. N-type semiconductor substrate 1 is prepared by cleaning a silicon substrate by a general method such as RCA cleaning, and doping it to the n-type. A high-permittivity layer 15 is formed on a main surface of n-type semiconductor substrate 1 as shown in FIG. 3, by a method such as MOCVD (Metal Organic Chemical Vapor Deposition), ALCVD (Atomic Layer Chemical Vapor Deposition), or a sputtering method. A high permittivity material such as $Al_2O_3$, $HfO_2$, $ZrO_2$, HfSiO, or ZrSiO is used as the material thereof.

Figure 4:
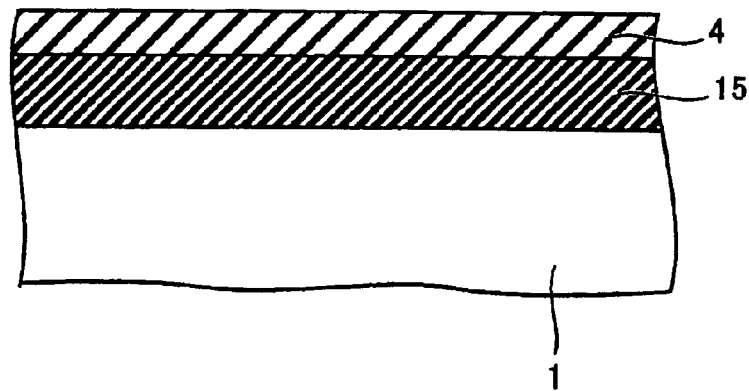

Thereafter, n-type semiconductor substrate 1 with high-permittivity layer 15 formed thereon is placed in an atmosphere of gas in a plasma state, which gas including nitrogen atoms, for example, $N_2$ or $NH_3$ gas, or such gas diluted with rare gas such as He, Ar or Kr, to nitride the surface of high-permittivity layer 15 to form high-permittivity nitride layer 4, as shown in FIG. 4. Plasma state of gas is obtained by using a microwave, high frequency or the like, and the nitriding processing is performed in a condition of relatively low temperature ranging from room temperature to 400° C. With this method, high-permittivity nitride layer 4 is formed only in a portion near the main surface of high-permittivity layer 15.

Figure 5:
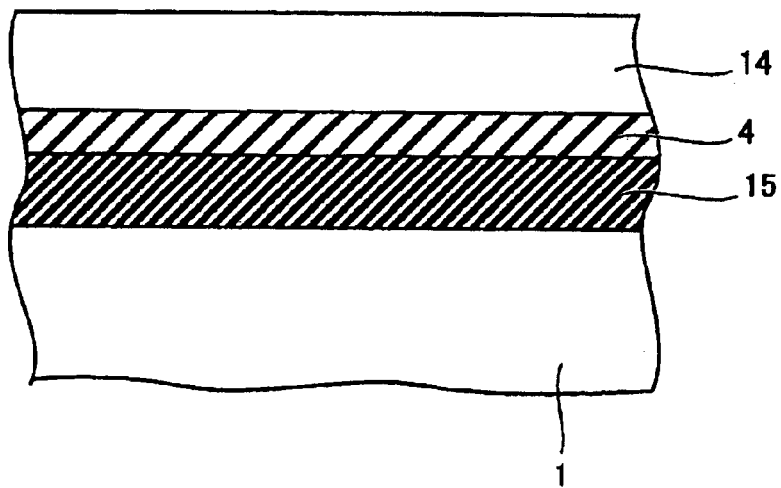

After the nitriding step is completed, a polysilicon layer 14 or an amorphous silicon layer is formed on an upper surface of high-permittivity nitride layer 4, as shown in FIG. 5. The layer is formed to have a thickness of 100–200 nm by low pressure CVD at 500–650° C. After the formation of polysilicon layer 14, boron is implanted by a method such as an ion implantation method. In addition to the ion implantation after forming the layer, implantation of boron as an impurity may also be performed by adding boron during the deposition of polysilicon layer 14. Alternatively, boron may be implanted into polysilicon layer 14 simultaneously with ion implantation for forming a source region and a drain region, which will be performed afterward.

Figure 6:
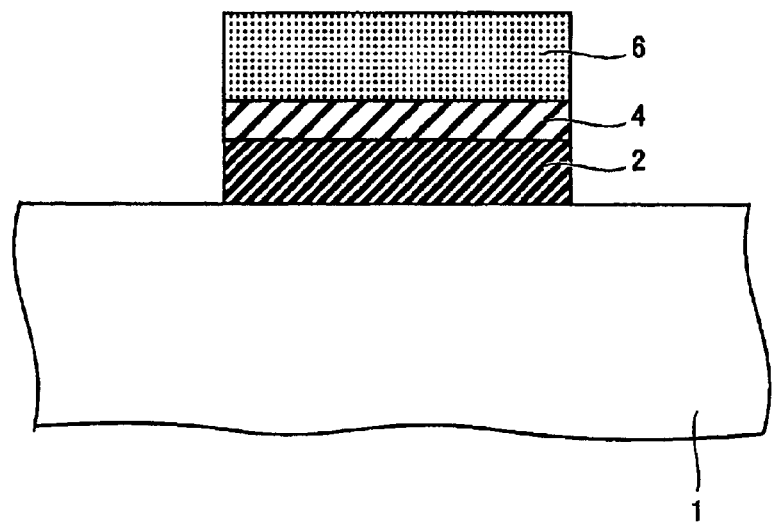
Figure 7:
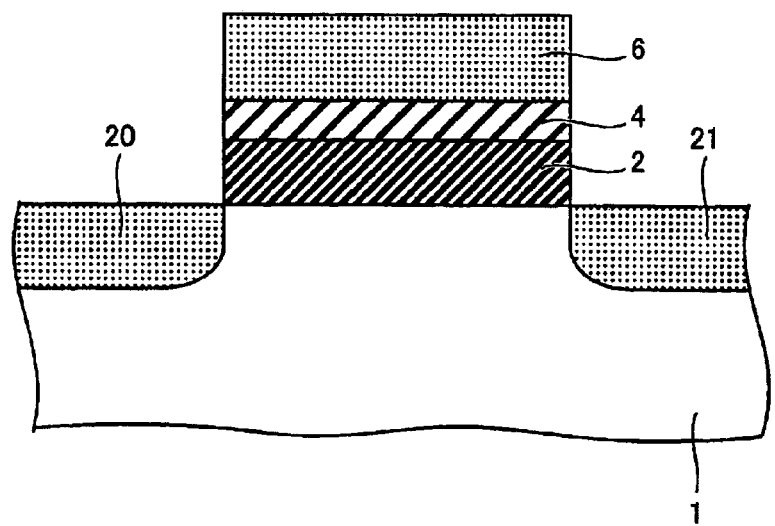

Patterning of a boron-doped gate electrode is then performed by an anisotropic etching method, and unnecessary portions of polysilicon layer 14, high-permittivity nitride layer 4 and high-permittivity layer 15 are removed. With this etching step, a form as shown in FIG. 6 is obtained. Thus, polysilicon layer 14 in FIG. 5 is doped with boron, and is anisotropically-etched to be a boron-doped gate electrode 6. Thereafter, p-type source region 20 and drain region 21 are formed by a method such as an ion implantaion method, as shown in FIG. 7. As described above, boron-doped gate electrode 6 may be formed in this step by implanting boron into polysilicon layer 14 instead of implanting boron in the previous step. In either situation, annealing is finally performed to activate boron in boron-doped gate electrode 6, source region 20 and drain region 21. In the annealing step, the semiconductor device is heated up to 900–1100° C. using inert gas such as $N_2$ or Ar. By this annealing, boron as an impurity is placed on proper lattice points within Si crystal and, at the same time, diffused due to the high temperature. In this step, high-permittivity nitride layer 4 can prevent boron implanted into boron-doped gate electrode 6 from being penetrating into high-permittivity insulator film 2 due to thermal diffusion.

By adopting this method, a nitride layer can be formed on an upper surface of a gate insulator film including a high permittivity material without an additional layer such as a polysilicon layer.

As manufacturing steps other than described above can be performed with a known technique, descriptions thereof are not given herein.

(Second Embodiment)

Figure 2:
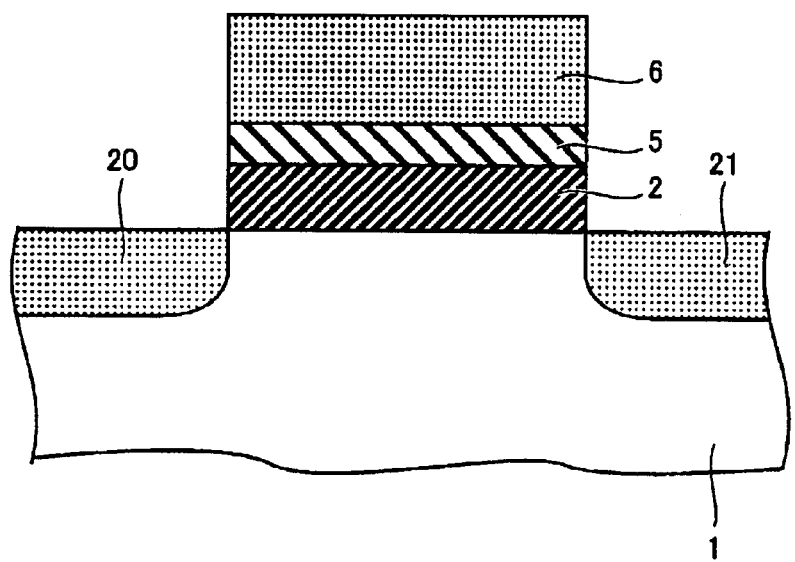
FIG. 2 is a cross-sectional view of a p-channel MOSFET in a second embodiment according to the present invention.

A structure of a semiconductor device in a second embodiment according to the present invention will now be described referring to FIG. 2.

Structures and materials of n-type semiconductor substrate 1 including source region 20 and drain region 21, and to boron-doped gate electrode 6 as a gate electrode are similar to those described in the first embodiment. Formation of high-permittivity insulator film 2 including a high permittivity material as a gate insulator film is also similar to the first embodiment. The difference is a nitride layer inhibiting diffusion of boron into the gate insulator film. In the first embodiment, the high-permittivity nitride layer was formed on the upper surface of the high-permittivity insulator film. In the second embodiment, the nitride layer made of polysilicon is formed on a main surface of the gate insulator film. A polysilicon nitride layer 5 is formed on the main surface of high-permittivity insulator film 2 by nitriding a thin layer of polysilicon having a thickness of about 0.5–1 nm. The nitride layer may be formed by similar nitriding using amorphous silicon in place of polysilicon.

Similar to the first embodiment, with this structure, the polysilicon nitride layer can inhibit the penetration of boron from the gate electrode, and the variation in the threshold voltage or decrease in the drive current capability can be inhibited. In addition, the current drive capability can be enhanced by making a thinner gate insulator film while keeping an effect to inhibit the heat diffusion of boron or a tolerance to penetrated boron from the gate electrode.

As the other portions of the structure are similar to these described in the first embodiment, the descriptions thereof will not be repeated.

Figure 8:
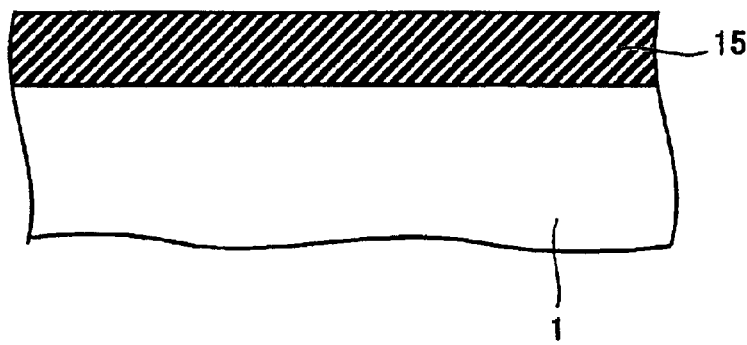
FIGS. 8 to 10 respectively show sequential manufacturing steps of the p-channel MOSFET in the second embodiment of the present invention.

A manufacturing method of the semiconductor device in this embodiment will now be described referring to FIGS. 8–10. As shown in FIG. 8, n-type semiconductor substrate 1 is prepared by cleaning a silicon substrate by a general method such as RCA cleaning, and doping it to the n-type. High-permittivity layer 15 including a high permittivity material is formed on a main surface of n-type semiconductor substrate 1 by a method such as MOCVD, ALCVD, or a sputtering method. Similar to the first embodiment, a material such as $Al_2O_3$, $HfO_2$, $ZrO_2$, HfSiO, or ZrSiO is used to form high-permittivity layer 15.

Figure 9:
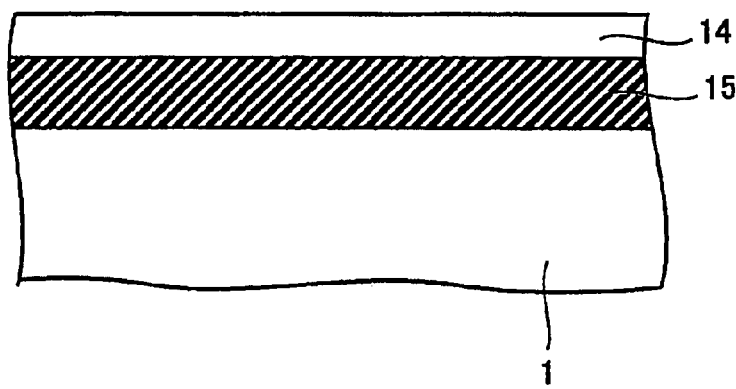
Figure 10:
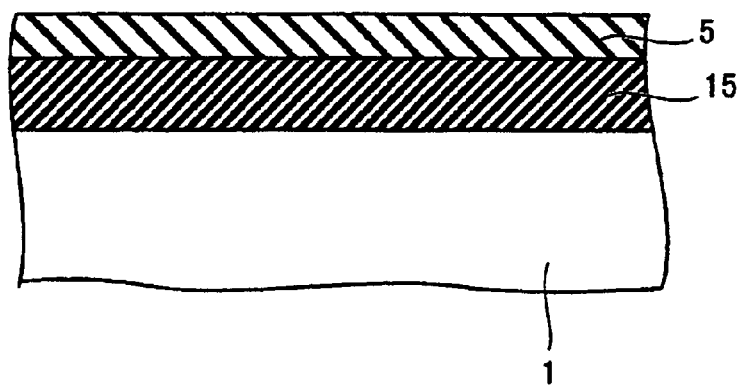
Figure 11:
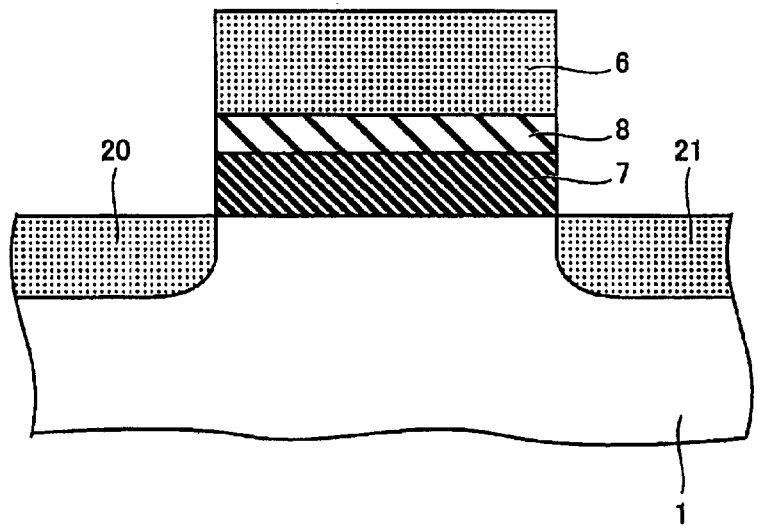
FIG. 11 is a cross-sectional view of a MOSFET according to a prior art.

Thereafter, as shown in FIG. 9, polysilicon layer 14 or an amorphous silicon layer is formed on the main surface of high-permittivity layer 15 by low pressure CVD at 500–650° C. The layer has a thickness, for example, of 0.5–1 nm.

The whole polysilicon layer 14 or amorphous silicon layer is then nitrided. The nitriding step is performed by placing the substrate in an atmosphere including nitrogen element in a plasma state as described in the first embodiment, or by high-temperature processing at 800–1000° C. using NO, $N_2O$ or $NH_3$ gas. Only a portion of the upper surface of polysilicon layer 14 may be nitrided, rather than nitriding the whole polysilicon layer. Additionally, a portion of high-permittivity layer 15 below polysilicon layer 14 may concurrently be nitrided. With this step, polysilicon nitride layer 5 is formed on the main surface of high-permittivity layer 15, as shown in FIG. 10.

As the steps, for example, of forming a gate electrode on the main surface of the nitride layer, and forming source and drain regions in the n-type semiconductor substrate are similar to those described in the first embodiment, the description thereof will not be repeated.

By adopting this method, a nitride layer can be formed on an upper surface of a high-permittivity layer by applying a part of a conventional nitride layer formation technique.

Though the structure and manufacturing method of the p-channel MOSFET are shown, the semiconductor device in each of the above-described embodiments is not limited to the p-channel MOSFET, and the present invention can also be utilized, for example, in a CMOSFET, which is a combination of p-type and n-type MOSFETs.

According to the present invention, a semiconductor device can be provided which can implement a thinner gate insulator film while keeping a tolerance to penetrated boron from a gate electrode by forming a nitride layer including a high-permittivity material between the gate electrode and the gate insulator film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate including a source region and a drain region in a main surface thereof;
    a gate insulator film including a high permittivity material and formed to cover an upper side of a region in a main surface of said semiconductor substrate interposed between said source region and said drain region;
    a gate electrode formed above said gate insulator film; and
    a nitride layer formed between said gate insulator film and said gate electrode, wherein said nitride layer includes nitride of said high permittivity material.

2. The semiconductor device according to claim 1, wherein said high permittivity material is selected from the group consisting of $Al_2O_3$, $HfO_2$, $ZrO_2$, HfSiO, and ZrSiO.

3. The semiconductor device according to claim 1, wherein said gate electrode comprises boron-doped polysilicon.

4. A semiconductor device, comprising:
    a semiconductor substrate including a source region and a drain region in a main surface thereof;
    a gate insulator film including a high permittivity material and formed to cover an upper side of a region in a main surface of said semiconductor substrate interposed between said source region and said drain region, wherein said high permittivity material is selected from the group consisting of $Al_2O_3$, $HfO_2$, $ZrO_2$, HfSiO, and ZrSiO;
    a gate electrode formed above said gate insulator film; and
    a nitride layer formed between said gate insulator film and said gate electrode.

5. The semiconductor device according to claim 4, wherein said nitride layer includes nitride of polysilicon or amorphous silicon.

6. The semiconductor device according to 4, wherein said gate electrode comprises boron-doped polysilicon.

* * * * *